US012610536B2

(12) United States Patent
Zeng

(10) Patent No.: US 12,610,536 B2
(45) Date of Patent: Apr. 21, 2026

(54) SEMICONDUCTOR STRUCTURE AND FABRICATION METHOD

(71) Applicant: ChangXin Memory Technologies, Inc., Hefei City (CN)

(72) Inventor: Yizhi Zeng, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 453 days.

(21) Appl. No.: 18/547,010

(22) PCT Filed: Oct. 31, 2022

(86) PCT No.: PCT/CN2022/128654
§ 371 (c)(1),
(2) Date: Aug. 18, 2023

(87) PCT Pub. No.: WO2023/240893
PCT Pub. Date: Dec. 21, 2023

(65) Prior Publication Data
US 2025/0024662 A1 Jan. 16, 2025

(30) Foreign Application Priority Data
Jun. 15, 2022 (CN) .......................... 202210674525.8

(51) Int. Cl.
*H10B 12/00* (2023.01)
(52) U.S. Cl.
CPC ........... *H10B 12/485* (2023.02); *H10B 12/02* (2023.02); *H10B 12/482* (2023.02)

(58) Field of Classification Search
CPC .... H10B 12/485; H10B 12/02; H10B 12/482; H10B 12/00; H10B 12/315; H10B 12/30
See application file for complete search history.

(56) References Cited

U.S. PATENT DOCUMENTS

| | | | | |
|---|---|---|---|---|
| 9,425,200 B2 * | 8/2016 | Hwang | ............... | H01L 23/5226 |
| 10,546,863 B1 * | 1/2020 | Kobayashi | ............ | H01L 23/528 |
| 2007/0155119 A1 * | 7/2007 | Muemmler | .......... | H10D 64/018 |
| | | | | 257/E21.429 |
| 2022/0045186 A1 * | 2/2022 | Lu | ......................... | H10D 64/517 |
| 2022/0293606 A1 * | 9/2022 | Chang | .................. | H10B 12/315 |

FOREIGN PATENT DOCUMENTS

| | | |
|---|---|---|
| CN | 111816561 A | 10/2020 |
| CN | 115050700 A | 9/2022 |

OTHER PUBLICATIONS

PCT/CN2022/128654 International Search Report mailed Feb. 23, 2023.

* cited by examiner

*Primary Examiner* — Victor A Mandala
(74) *Attorney, Agent, or Firm* — SYNCODA LLC; Feng Ma

(57) ABSTRACT

A semiconductor structure and a fabricating method are disclosed. The method includes: providing a substrate; forming a bit line contact structure and a bit line on the substrate; the bit line contact structure is located between the bit line and the substrate; performing ion doping treatment on the sidewalls of the lower part of the bit line contact structure to forming a doped region; performing nitridation treatment on the doped region to transform the doped region into a nitride structure.

15 Claims, 10 Drawing Sheets

S10 a subsproviding trate

S20 a bit line contact structure is located between the bit line and the substrate

S30 performing ion doping treatment on the sidewalls of the lower part of the bit line contact structure to form a doped region

S40 transforming the doped region into a nitride structure by nitridation of the doped region

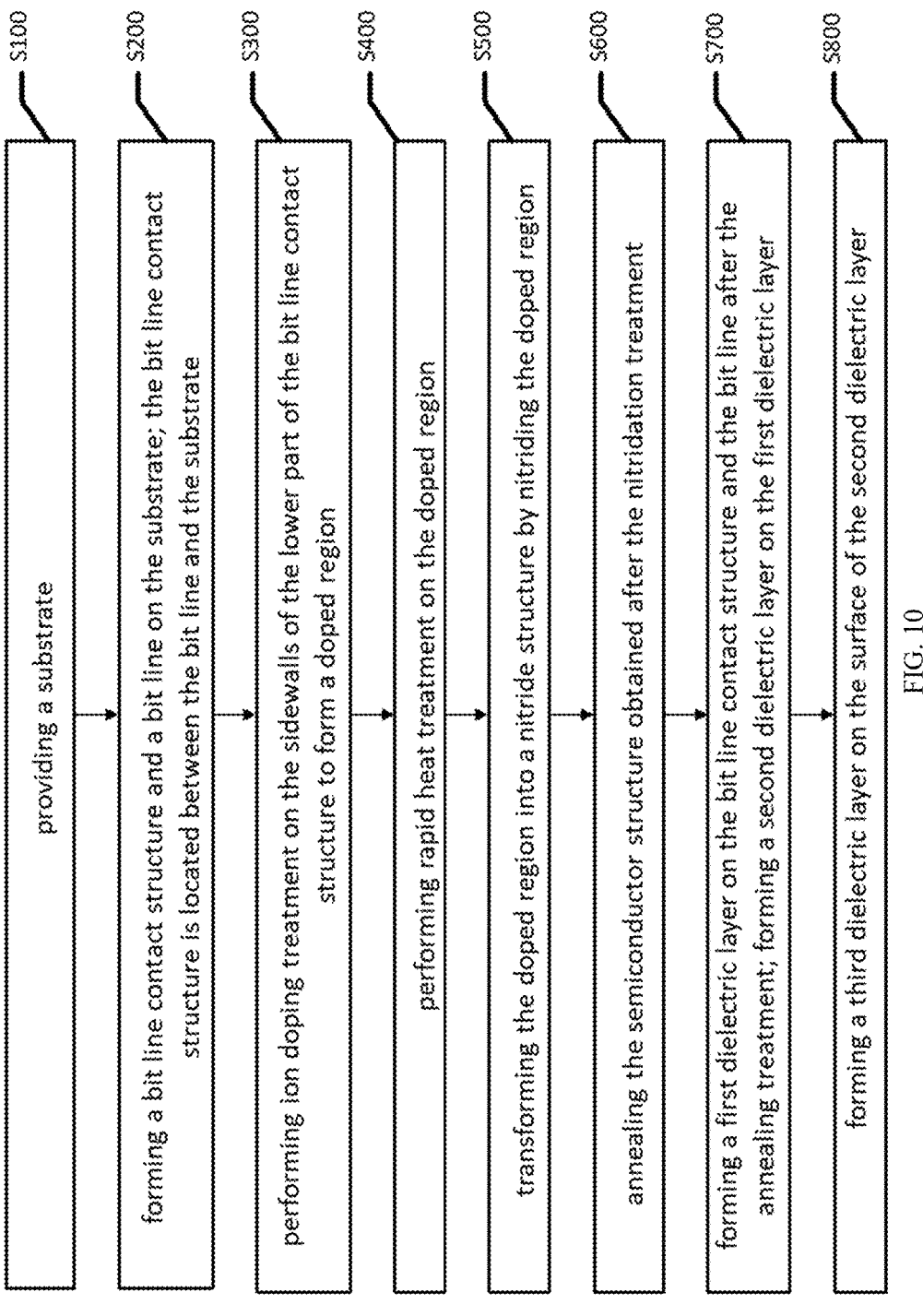

providing a substrate — S100 forming a bit line contact structure and a bit line on the substrate; the bit line contact structure is located between the bit line and the substrate — S200 performing ion doping treatment on the sidewalls of the lower part of the bit line contact structure to form a doped region — S300 performing rapid heat treatment on the doped region — S400 transforming the doped region into a nitride structure by nitriding the doped region — S500 annealing the semiconductor structure obtained after the nitridation treatment — S600 forming a first dielectric layer on the bit line contact structure and the bit line after the annealing treatment; forming a second dielectric layer on the first dielectric layer — S700 forming a third dielectric layer on the surface of the second dielectric layer — S800

FIG. 10

SEMICONDUCTOR STRUCTURE AND FABRICATION METHOD

CROSS REFERENCES TO RELATED APPLICATIONS

This application is a national stage entry of International Application No. PCT/CN2022/128654 filed Oct. 31, 2022, which claims the benefit of priority of Chinese patent application with the application number 202210674525.8, entitled "A SEMICONDUCTOR STRUCTURE AND FABRICATION METHOD", filed on Jun. 15, 2022, the contents of which are incorporated herein by reference in its entirety.

TECHNICAL FIELD

The present disclosure relates to the field of semiconductor technology, and in particular, to a semiconductor structure and a manufacturing method thereof.

BACKGROUND

With the development of semiconductor technology, reduction of line width is of great significance to the reduction of semiconductor devices sizes. For example, in a dynamic random access memory (DRAM for short), reducing the line width of a bit line can provide a richer design basis for the DRAM and reduce the design size of the DRAM. In the traditional bit line processing process, sidewalls of lower parts of bit line contact structures tend to have a certain inclination angle, resulting in larger widths of the lower part of the bit line contact structures, which in turn restricts the reduction of the bit line width.'

SUMMARY

Therefore, it is necessary to provide a semiconductor structure and its preparation method in order to eliminate the inclination angle of the lower sidewalls of the bit line contact structure and provide a basis for reducing the width of the bit line.

The first embodiment of the present disclosure provides a method for preparing a semiconductor structure, including:

provide the substrate;

forming a bit line contact structure and a bit line on the substrate; the bit line contact structure is located between the bit line and the substrate;

performing ion doping treatment on the sidewalls of the lower part of the bit line contact structure to form a doped region;

Nitridation treatment is performed on the doped region to transform the doped region into a nitride structure.

In one embodiment, the ion dose of the ion doping treatment is $10^4$ cm$^{-2}$~$10^5$ cm$^{-2}$.

In one of the embodiments, the ions used in the ion doping treatment include ions of Group V elements.

In one embodiment, the ions used in the ion doping treatment include at least one of arsenic ions and phosphorus ions.

In one of the embodiments, after the nitridation treatment of the doped region, further comprising:

An annealing treatment is performed on the semiconductor structure obtained after the nitridation treatment.

In one embodiment, the temperature of the annealing treatment is from 550° C.-650° C.

In one embodiment, the time for the annealing treatment is from 50 minutes to 70 minutes.

In one of the embodiments, before performing the nitridation treatment on the doped region, it also includes:

Rapid heat treatment is performed on the doped region.

In one of the embodiments, the nitridation pf the doped region includes:

reactive nitridation of the doped region with nitrogen; or,

A silicon nitride layer is formed on the surface of the doped region to nitride the doped region.

In one of the embodiments, the forming a bit line contact structure and a bit line on the substrate includes:

forming a bit line contact hole in the substrate;

forming a bit line contact material layer in the bit line contact hole;

forming a bit line material layer on the upper surface of the bit line contact material layer;

The bit line contact material layer and the bit line material layer are etched to obtain a bit line contact structure and a bit line.

In one of the embodiments, after nitridation of the doped region, it further includes:

forming a first dielectric layer on the bit line contact structure and the surface of the bit line after nitridation treatment;

A second dielectric layer is formed on the surface of the first dielectric layer; wherein, the first dielectric layer and the second dielectric layer are filled in the bit line contact hole.

In one of the embodiments, before forming the bit line contact structure and the bit line on the substrate, it further includes:

A shallow trench isolation structure is formed in the substrate, and the shallow trench isolation structure isolates a plurality of active regions arranged at intervals in the substrate; the bit lines extend along a first direction, the active region extends along a second direction, the first direction intersecting the second direction.

In one embodiment, the bit line includes a first bit line conductive layer, a second bit line conductive layer and a bit line protection layer stacked in sequence from bottom to top.

In one of the embodiments, the material of the first bit line conductive layer includes titanium nitride.

In one embodiment, the material of the second bit line conductive layer includes tungsten.

In one of the embodiments, the material of the bit line protection layer includes silicon nitride.

The second aspect of the embodiments of the present disclosure provides a semiconductor structure, which is prepared according to the method for preparing a semiconductor structure described in any of the above embodiments; the semiconductor structure includes:

a substrate;

a bit line contact structure located on the surface of the substrate and in contact with the substrate;

a nitride structure located on the sidewalls of the lower part of the bit line contact structure and in contact with the substrate; and a bit line is located on the bit line contact structure.

In one embodiment, the semiconductor structure includes:

a first dielectric layer covering the bit line contact structure, the nitride structure and the surface of the bit line; and the second medium layer covers the surface of the first medium layer.

An embodiment of the present disclosure provides a method for fabricating a semiconductor structure, first trimming the sidewalls of the lower part of the bitline contact structure by performing ion doping and nitridation treatment on the sidewalls of the lower part of the bitline contact structure. Specifically, for the problem that the sidewalls of the lower part of the bitline contact structure is prone to inclination, ion doping treatment is used to form a doped region on the sidewalls of the lower part of the bitline contact structure. During the subsequent nitridation process, the bitline contact structure in the doped region is easy to be nitridated, and the bit line contact structure outside the doped area is not easy to be nitridated, so that the bit line contact structure can be selectively trimmed, the lower inclination angle of the bit line contact structure can be eliminated, and the consistency of the bit line width can be improved, which can provide a basis for reducing the width of the bit line.

BRIEF DESCRIPTION OF THE DRAWINGS

Reference may be made to one or more of the accompanying drawings for a better description and illustration of the disclosed embodiments and/or examples disclosed herein. Additional details or examples used to describe the figures should not be considered limitations on the scope of any of the disclosed disclosure, the presently described embodiments and/or examples, and the best mode of these disclosures currently understood.

FIG. 10 is a flowchart of a method for fabricating a semiconductor structure provided in another embodiment of the present disclosure.

Figure 1:
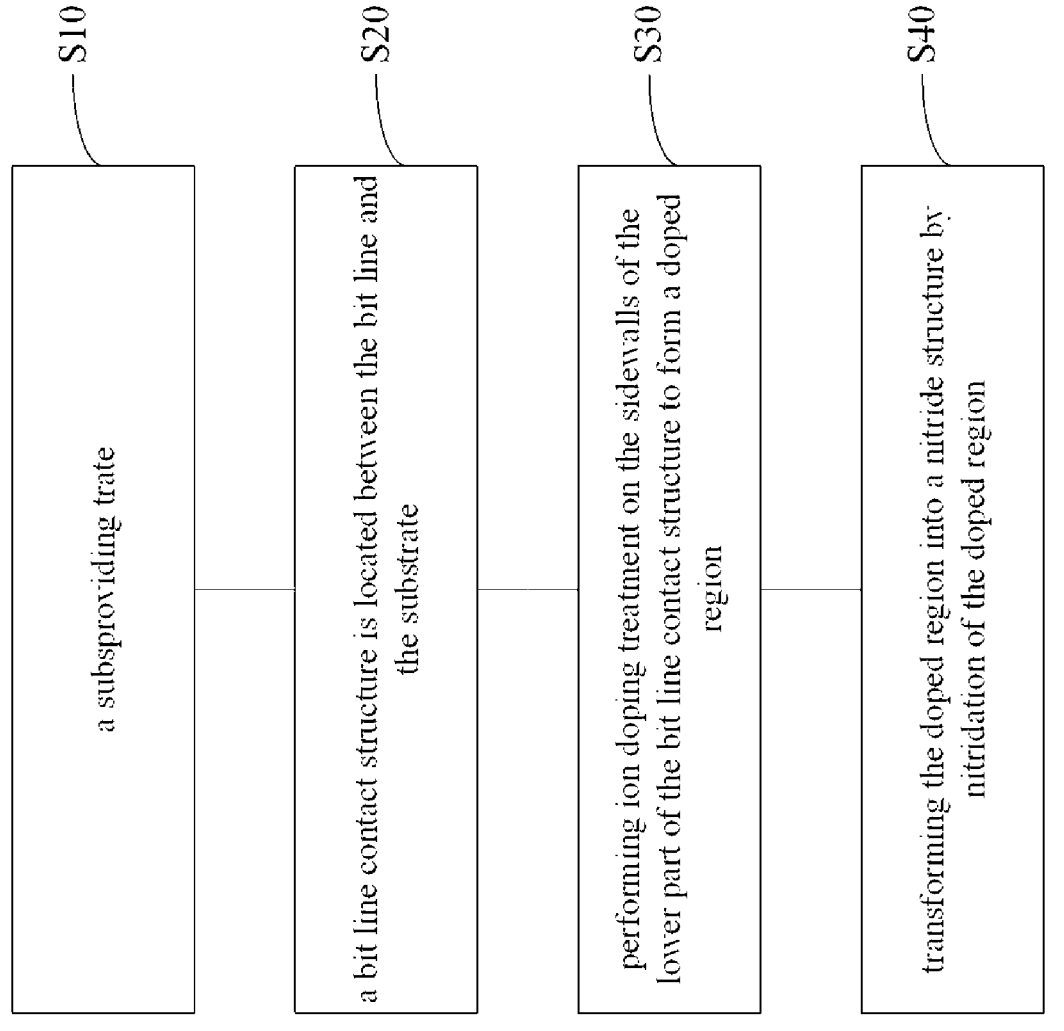
FIG. 1 is a flowchart of a method for fabricating a semiconductor structure provided in an embodiment of the present disclosure.

Reference numerals in the figures:

100, substrate; 101, bit line contact hole; 102, active region; 103, shallow trench isolation structure; 200, bit line contact structure; 201, doped region; 202, nitride structure; 300, bit line; 301, the first bit line conductive layer; 302, the second bit line conductive layer; 303, the bit line protection layer; 400, the first dielectric layer; 500, the second dielectric layer; 600, the third dielectric layer.

DETAILED DESCRIPTION OF THE PREFERRED EMBODIMENTS

In order to facilitate understanding of the present disclosure, the present disclosure will be described more fully below with reference to the related drawings. The preferred embodiments of the present disclosure are shown in the drawings. However, the present disclosure can be embodied in many different forms and is not limited to the embodiments described herein. Rather, these embodiments are provided so that the disclosure of the present disclosure will be thorough and complete.

Unless otherwise defined, all technical and scientific terms used herein have the same meaning as commonly understood by one of ordinary skill in the art to which this disclosure belongs. The terms used herein in the description of the present disclosure are for the purpose of describing specific embodiments only, and are not intended to limit the present disclosure. As used herein, the term "and/or" includes any and all combinations of one or more of the associated listed items.

It will be understood that when an element or layer is referred to as being "on," "adjacent," "connected to" or "coupled to" another element or layer, it can be directly on the other element or layer. A layer may be on, adjacent to, connected to, or coupled to other elements or layers, or intervening elements or layers may be present. In contrast, when an element is referred to as being "directly on," "directly adjacent to," "directly connected to," or "directly coupled to" another element or layer, there are no intervening elements or layers present. layer. It will be understood that, although the terms first, second, third etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatial terms such as "below", "below", "below", "under", "on", "above", etc., in This may be used for convenience of description to describe the relationship of one element or feature to other elements or features shown in the figures. It will be understood that the spatially relative terms are intended to encompass different orientations of the device in use and operation in addition to the orientation depicted in the figures. For example, if the device in the figures is turned over, elements or features described as "below" or "beneath" or "beneath" other elements or features would then be oriented "above" the other elements or features. Thus, the exemplary terms "below" and "beneath" can encompass both an orientation of above and below. The device may be otherwise oriented (rotated 90 degrees or at other orientations) and the spatial descriptors used herein interpreted accordingly.

The terminology used herein is for the purpose of describing particular embodiments only and is not to be taken as a limitation of the present disclosure. As used herein, the singular forms "a", "an" and "the/the" are intended to include the plural forms as well, unless the context clearly dictates otherwise. It should also be understood that the terms "consists of" and/or "comprising", when used in this specification, identify the presence of stated features, integers, steps, operations, elements and/or parts, but do not exclude one or more other present or additional features, integers, steps, operations, elements, parts and/or groups. As used herein, the term "and/or" includes any and all combinations of the associated listed items.

Embodiments of the application are described herein with reference to cross-section illustrations that are schematic illustrations of idealized embodiments (and intermediate structures) of the disclosure. As such, variations from the shapes shown are to be expected due to, for example, manufacturing techniques and/or tolerances. Thus, embodiments of the present disclosure should not be limited to the particular shapes of the regions shown herein but are to include deviations in shapes due to, for example, manufacturing, the regions shown in the figures are schematic in nature and their shapes are not intended to be the actual shapes of the regions of the device are shown and are not intended to limit the scope of the present disclosure.

In one embodiment of the present disclosure, as shown in FIG. 1, a method for preparing a semiconductor structure is provided, including:

Step S10: providing a substrate.

Step S20: forming a bit line contact structure and a bit line on the substrate; a bit line contact structure is located between the bit line and the substrate.

Step S30: performing ion doping treatment on the side-
walls of the lower part of the bit line contact structure
to form a doped region.

Step S40: Nitridation of the doped region to transform the
doped region into a nitride structure.

In the manufacturing method of the semiconductor struc-
ture in this embodiment, the sidewalls of the lower part of
the bitline contact structure is trimmed mainly by perform-
ing ion doping treatment and nitridation treatment on the
sidewalls of the lower part of the bitline contact structure.
Specifically, during the processing of the bit line contact
structure, when the traditional method such as etching is
used for processing, a certain inclination angle is likely to
appear on the sidewalls of the lower part of the bit line
contact structure, and the existence of this inclination angle
will cause the line width of the lower part of the bit line
contact structure becomes larger, which restricts the further
narrowing of the width of the bit line and affects the
conduction performance of the bit line. In the embodiment
of the present disclosure, for the problem that the sidewalls
of the lower part of the bit line contact structure tends to
have an inclination angle, ion doping treatment is used to
form a doped region on the side wall of the lower part of the
bit line contact structure. During the subsequent nitridation
process, the bit line contact structure in the doped area is
easy to be nitridated, and the bit line contact structure
outside the doped area is not easy to be nitridated, so that the
bit line contact structure can be selectively trimmed, the
lower inclination angle of the bit line contact structure can
be eliminated, and the bit line contact structure can be
improved. The consistency of the line width can provide a
basis for reducing the line width of the bit line.

Referring to FIG. 1, in some embodiments of the present
disclosure, the substrate provided in step S10 may be formed
of a semiconductor base such as a silicon wafer. The material
of the substrate includes but not limited to single crystal
silicon, polycrystalline silicon or amorphous silicon; the
substrate includes but not limited to single crystal silicon
substrate, polycrystalline silicon substrate or amorphous
silicon substrate.

Figure 2:
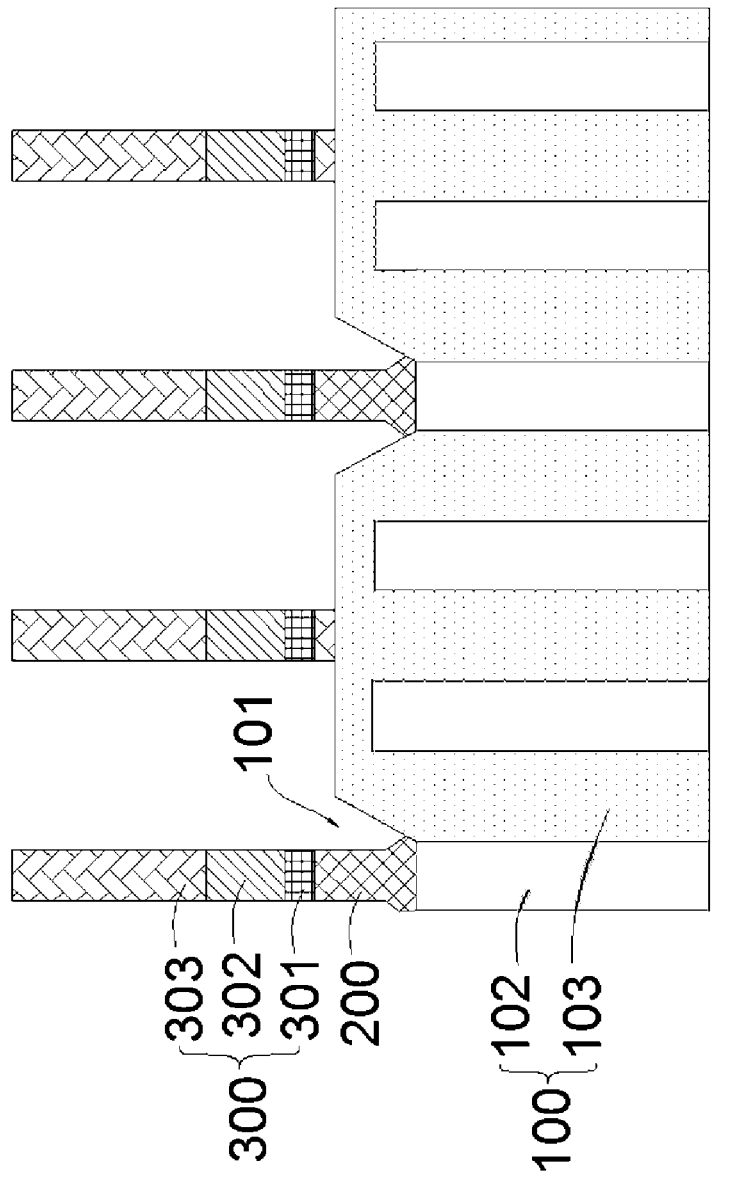
FIGS. 2 to 9 are structural schematic diagrams disclosing after each step for preparing a semiconductor structure in the method according to an embodiment of the present disclosure.

Referring to FIG. 1 and FIG. 2, in some embodiments of
the present disclosure, in step S20, as an example of forming
a bit line contact structure 200 and a bit line 300 on the
substrate 100, it includes: form a bit line contact hole 101,
form a bit line contact material layer in the bit line contact
hole 101, form a bit line material layer on the upper surface
of the bit line contact material layer; etch the bit line contact
material layer and the bit line material layer, so a bit line
contact structure 200 and a bit line 300 are obtained, as
shown in FIG. 2. It can be understood that the bit line contact
material layer may include but not limited to a doped
polysilicon layer. Optionally, a deposition process may be
used to form the bit line contact material layer in the bit line
contact hole 101. For example, a bit line contact material is
deposited in the bit line contact hole 101 through a deposi-
tion process to form a bit line contact material layer. When
performing the deposition process of the bit line contact
material, the deposition process may include but not limited
to a chemical vapor deposition process, a physical vapor
deposition process or an atomic layer deposition process.
Optionally, when forming the bit line material layer on the
upper surface of the bit line contact material layer, a depo-
sition process may be used. For example, the bit line 300
material is deposited on the upper surface of the bit line
contact material layer by a deposition process on the upper
surface of the bit line contact material layer to form the bit
line material layer. When the bit line 300 material deposition process is performed, the deposition process may include
but not limited to a chemical vapor deposition process, a
physical vapor deposition process or an atomic layer depo-
sition process. Alternatively, when etching the bit line con-
tact material layer and the bit line material layer, a dry
etching process or a wet etching process may be used. When
dry etching is used, ion milling etching, plasma etching or
reactive ion etching can be used. In a specific embodiment,
gas plasma is selected for dry etching. For example, when
performing dry etching, a reactive etching gas is selected for
etching, and the reactive etching gas may be Cl2, CF4, or the
like. When wet etching is used, the etching solution may be
nitric acid, ammonium fluoride, hydrofluoric acid, ethylene-
diamine, sodium carbonate, and the like. In a specific
embodiment, the etching solution includes ammonium fluo-
ride and hydrofluoric acid.

Please continue to refer to FIG. 2, the bit line 300 includes
a first bit line conductive layer 301, a second bit line
conductive layer 302 and a bit line protection layer 303
stacked in sequence from bottom to top. The bit line contact
structure 200 is located between the first bit line conductive
layer 301 and the substrate 100. As a selection example of
the material of the first bit line conductive layer 301, the
material of the first bit line conductive layer 301 includes but
not limited to titanium nitride, tungsten or titanium tungsten.
As a selection example of the material of the second bit line
conductive layer 302, the material of the second bit line
conductive layer 302 includes but not limited to tungsten,
titanium tungsten or titanium nitride. As a selection example
of the material of the bit line protection layer 303, the
material of the bit line protection layer 303 includes but not
limited to silicon nitride, silicon oxynitride or silicon diox-
ide. In a specific example, the materials of the first bit line
conductive layer 301, the second bit line conductive layer
302 and the bit line protection layer 303 are titanium nitride,
tungsten and titanium nitride respectively.

Please continue to refer to FIG. 2. The bit line 300
includes a first bit line conductive layer 301, a second bit line
conductive layer 302, and a bit line protective layer 303
stacked in sequence from bottom to top, the upper surface of
the bit line contact material layer, forming the bit line
material layer includes: sequentially forming a first bit line
conductive material layer, a second bit line conductive
material layer and a bit line protective material layer on the
upper surface of the bit line contact material layer. Option-
ally, sequentially forming the first bit line conductive mate-
rial layer, the second bit line conductive material layer and
the bit line protective material layer on the upper surface of
the bit line contact material layer may be performed by a
deposition process. That is, a first bit line conductive mate-
rial layer, a second bit line conductive material layer and a
bit line protective material layer are sequentially formed on
the upper surface of the bit line contact material layer
through a deposition process. Also optionally, the deposition
process may use a chemical vapor deposition process. It can
be understood that after the first bit line conductive material
layer, the second bit line conductive material layer and the
bit line protective material layer are sequentially formed on
the upper surface of the bit line contact material layer
through a deposition process, the first bit line conductive
material layer, the second bit line conductive material layer
and the bit line protective material layer are etched to obtain
the first bit line conductive layer 301, the second bit line
conductive layer 302 and the bit line protective layer 303
which are sequentially stacked from bottom to top.

Optionally, the bit line 300 includes a first bit line
conductive layer 301, a second bit line conductive layer 302, and a bit line protection layer 303 stacked sequentially from bottom to top, and the bit line contact structure 200 and the bit line contact structure 200 are formed on the substrate 100. The line 300 includes: a bit line contact hole 101 is formed in the substrate 100, a bit line contact material layer is formed in the bit line contact hole 101, a first bit line conductive material layer, a second bit line conductive material layer are sequentially formed on the upper surface of the first bit line contact material layer, the second bit line conductive material layer and bit line protective material layer; etching the bit line contact material layer, the first bit line conductive material layer, the second bit line conductive material layer and the bit line protective material layer to obtain bit line contact structure 200 and bit line 300.

Figure 3:
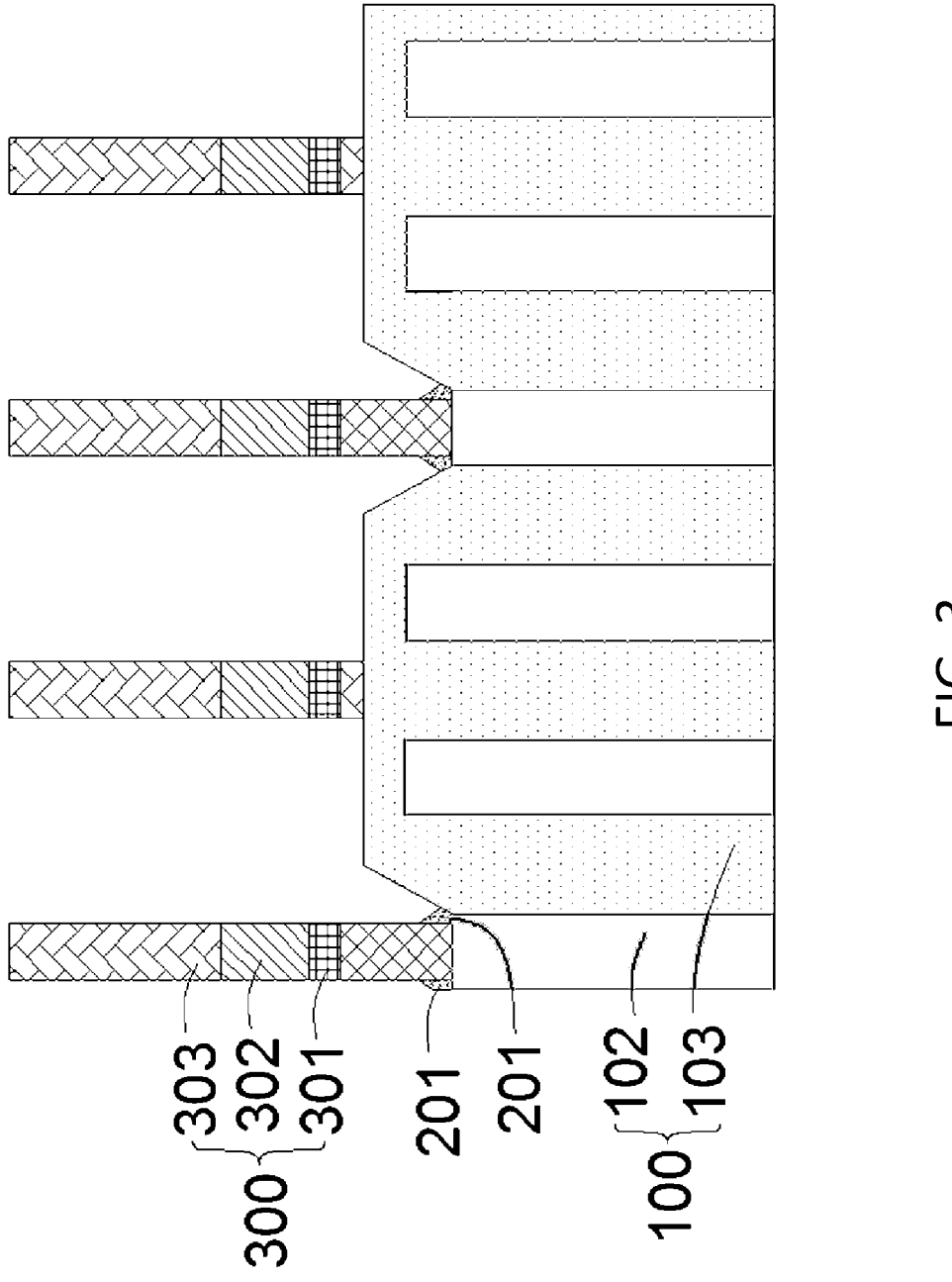
Figure 4:
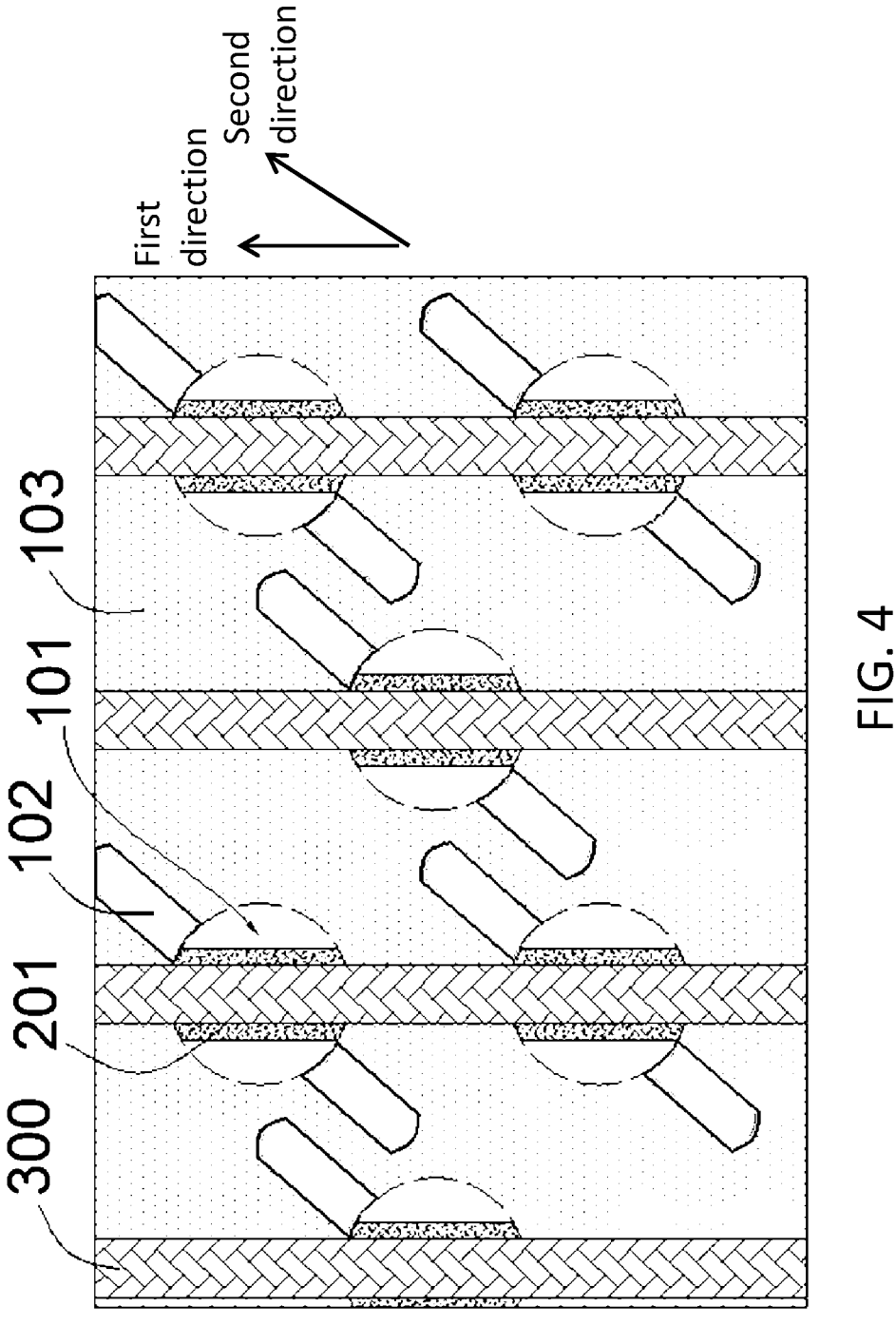

Please refer to FIG. 1, FIG. 3 and FIG. 4, wherein FIG. 4 is a top view of the semiconductor structure corresponding to FIG. 3. In some embodiments of the present disclosure, in step S30, ion doping is performed on the sidewalls of the lower part of the bit line contact structure 200 to form a doped region 201, as shown in FIGS. 3 and 4. Through the ion doping process, the doped region 201 can be formed on the sidewalls of the lower part of the bit line contact structure 200. Region 201 is consumed, and the bit line contact structure 200 outside the doped region 201 is not easily consumed by nitridation of, which can effectively remove the inclination angle of the lower sidewalls of the bit line contact structure 200, improve the consistency of the width of the bit line contact structure 200, and further It can provide a basis for reducing the line width of the bit line 300.

In some embodiments of the present disclosure, the height of the doped region 201 formed on the lower sidewalls of the bit line contact structure 200 in the direction vertical to the substrate surface is less than one third of the height of the bit line contact structure 200 in the direction vertical to the substrate surface. one. Optionally, in some other embodiments, the height of the doped region 201 formed on the lower sidewalls of the bit line contact structure 200 in the direction vertical to the substrate surface is smaller than the height of the bit line contact structure 200 in the direction vertical to the substrate surface. a quarter. Optionally, in some other embodiments, the height of the doped region 201, formed on the lower sidewalls of the bit line contact structure 200 in the direction vertical to the substrate surface, is smaller than one fifth of the height of the bit line contact structure 200 in the direction vertical to the substrate surface.

Please continue to refer to FIG. 3 and FIG. 4, in some embodiments of the present disclosure, on the one hand, the ion dose of the ion doping treatment is $10^4$ cm$^{-2}$ to $10^5$ cm$^{-2}$. For example, the ion dose of ion doping treatment can be $2\times10^4$ cm$^{-2}$, $4\times10^4$ cm$^{-2}$, $5\times10^4$ cm$^{-2}$, $7\times10^4$ cm$^{-2}$, $8\times10^4$ cm$^{-2}$. Of course, the ion dose of the ion doping treatment can also be selected within the range of less than $10^4$ cm$^{-2}$ or greater than $10^5$ cm$^{-2}$. On the other hand, the doping depth of the ion doping treatment is 10 nm to 20 nm. For example, the doping depth of the ion doping treatment may be 11 nm, 12 nm, 14 nm, 16 nm, or 18 nm. Of course, the doping depth of the ion doping treatment can also be selected in other appropriate ranges within the range of less than 10 nm or greater than 20 nm.

Optionally, as an example of ion doping treatment, an ion implantation process, such as a remote plasma process, can be used to implant ions into the sidewalls of the lower part of the bit line contact structure 200, and then form a doped layer on the side wall of the lower part of the bit line contact structure 200. Miscellaneous area 201. When using the ion implantation process to implant ions, the angle of ion implantation is perpendicular to the substrate surface, so as to avoid the vertical sidewalls of the nitridation of bit line contact structure, thereby maintaining the vertical morphology of the bit line contact structure and the bit line. In addition, one or more ion implantations may be performed according to the requirements of the doping process, so that the implanted ions meet the requirements of ion doping in terms of depth and concentration.

In some embodiments of the present disclosure, the ions used in the ion doping process include ions of Group V elements. Optionally, the ions used in the ion doping treatment include either arsenic ions or phosphorus ions at least.

Figure 5:
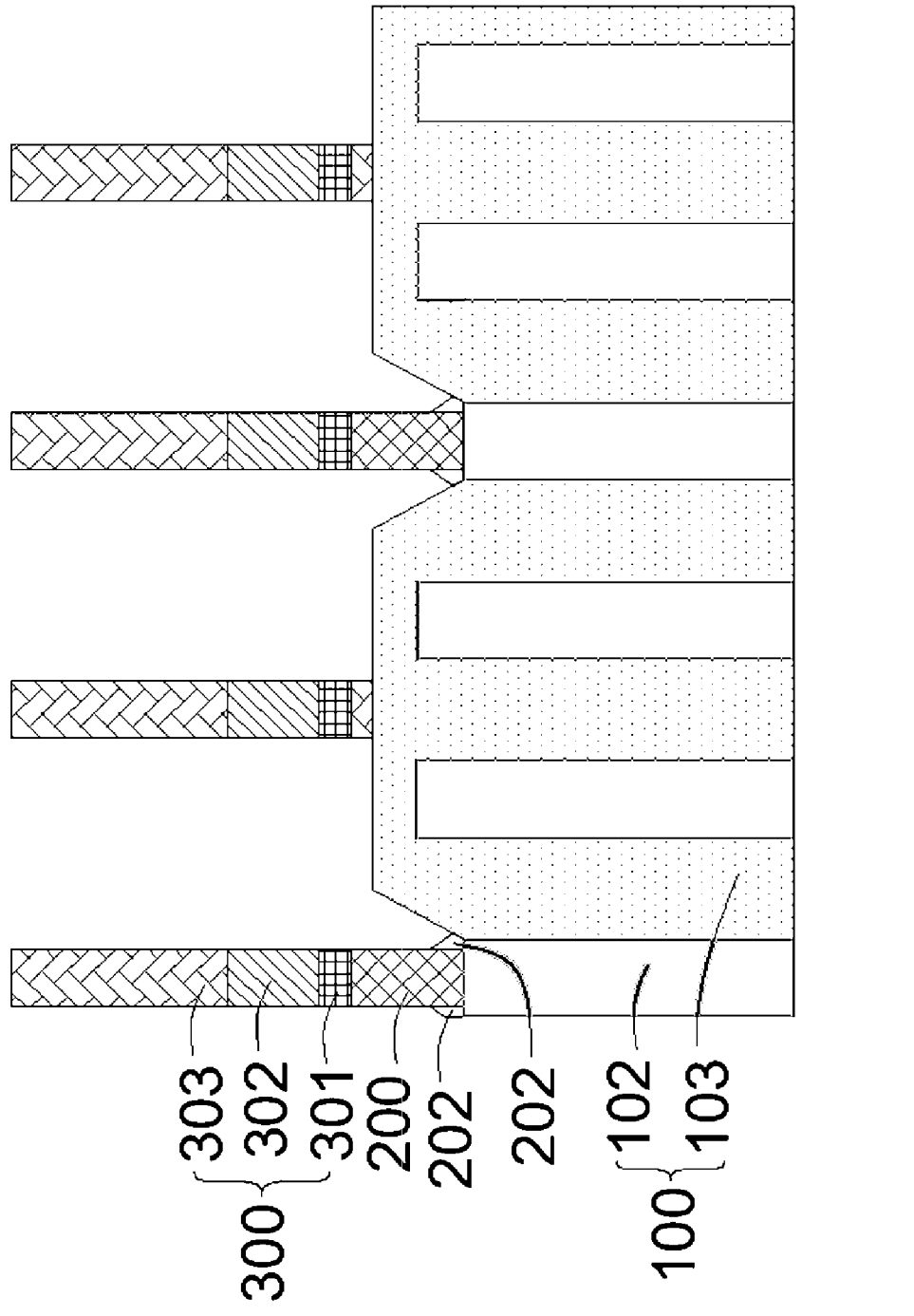

Referring to FIG. 1 and FIG. 5, in some embodiments of the present disclosure, in step S40, the doped region 201 is subjected to nitridation treatment, so as to convert the doped region 201 into a nitride structure 202, as shown in FIG. 5. Through nitridation, the bit line contact structure 200 of the doped region 201 can be nitridated, and the inclination angle of the sidewalls of the lower part of the bit line contact structure 200 can be removed. Optionally, performing nitridation treatment on the doped region 201 includes: reactive nitridation of the doped region 201 with nitrogen gas; or, forming a silicon nitride layer on the surface of the doped region 201.

In some embodiments of the present disclosure, the doped region 201 may be converted into a nitride structure 202 by nitridation of the doped region 201 using a plasma nitrogen doping process. For example, in a nitrogen-containing atmosphere of 0.1-10 Torr, a DC voltage is applied to ionize the nitrogen gas, and then the ionized nitrogen-containing gas is sputtered on the surface of the doped region 201.

In some embodiments of the present disclosure, after performing the nitridation treatment on the doped region 201, further includes: performing annealing treatment on the semiconductor structure obtained after the nitridation treatment. The annealing process can make the effect of the nitridation treatment more sufficient, promote the consumption of the bit line contact structure 200 in the doped region 201, and improve the top-to-bottom alignment of the bit line contact structure 200.

Optionally, as an example of temperature selection of the annealing treatment, the temperature of the annealing treatment is from 550° C. to 650° C. For example, the temperature of the annealing treatment may be selected from about 550° C., 580° C., 600° C., 630° C., and 640° C. Of course, the temperature of the annealing treatment can also be selected within the range of lower than 550° C. or higher than 650° C.

Optionally, as an example of time selection for the annealing treatment, the time for the annealing treatment is 50 minutes to 70 minutes. For example, the time for the annealing treatment may be selected from 50 minutes, 55 minutes, 60 minutes, 65 minutes and 70 minutes. Of course, the annealing treatment time can also be selected within the range of less than 50 minutes or more than 70 minutes.

In some embodiments of the present disclosure, before performing nitridation treatment on the doped region 201, further includes: performing rapid thermal treatment on the doped region 201. The doping ions in the doped region 201 can be activated by rapid heat treatment, so that the doped region 201 can be more easily nitridated, which is beneficial to reduce the difficulty of nitridation treatment and improve the efficiency of nitridation treatment.

Optionally, as an example of selecting conditions for the rapid heat treatment, the temperature of the rapid heat treatment is 800° C. to 1200° C., and the temperature rise rate of the rapid heat treatment is from 10° C./sec to 100°

C./sec. At this time, when performing rapid heat treatment on the doped region 201, the temperature of the doped semiconductor structure is raised from the initial temperature from 800° C. to 1200° C. at a heating rate of 10° C./sec~100° C./sec. Further optionally, the temperature of the rapid heat treatment may be, but not limited to about, 850° C., 900° C., 1000° C., 1050° C., 1150° C. The heating rate of the rapid heat treatment may be, but not limited to, 20° C./s, 30° C./sec, 50° C./s, 60° C./sec, 90° C./sec. Of course, the temperature of the rapid heat treatment can also be selected within the range of lower than 800° C. or higher than 1200° C. The heating rate of the rapid heat treatment can also be selected within the range of less than 10° C./sec or greater than 100° C./sec. Further optionally, when performing the rapid heat treatment, the initial temperature of the semiconductor structure after doping may be room temperature. That is, during the rapid heat treatment, the temperature of the doped semiconductor structure is raised from normal temperature to 800° C. to 1200° C. at a heating rate of 10° C./sec~100° C./sec. Further optionally, the processing time of the rapid heat treatment at a temperature of 800° C. to 1200° C. is on the order of milliseconds.

In some embodiments of the present disclosure, the doped region 201 is transformed into a nitride structure 202 comprising nitrogen-doped polysilicon.

Figure 6:
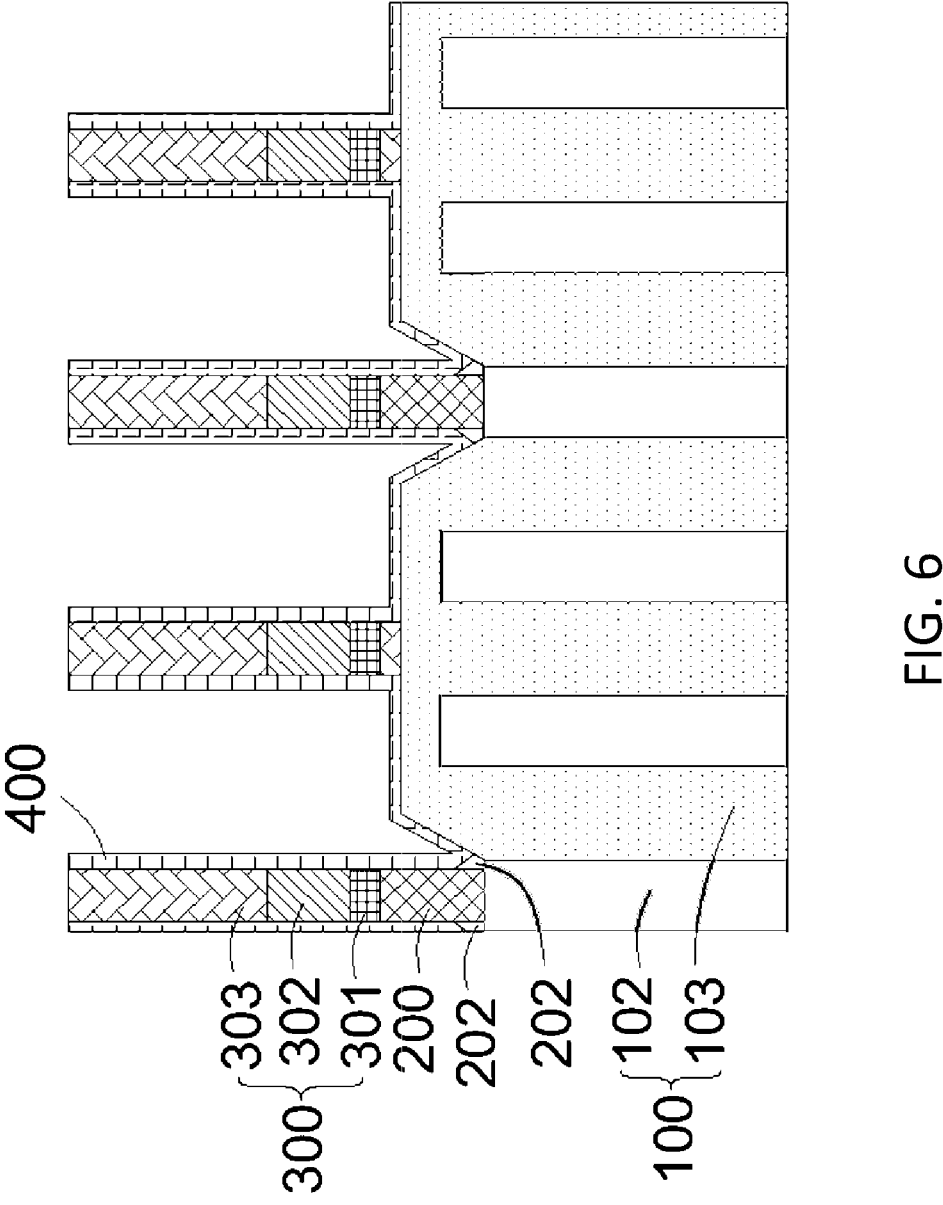
Figure 7:
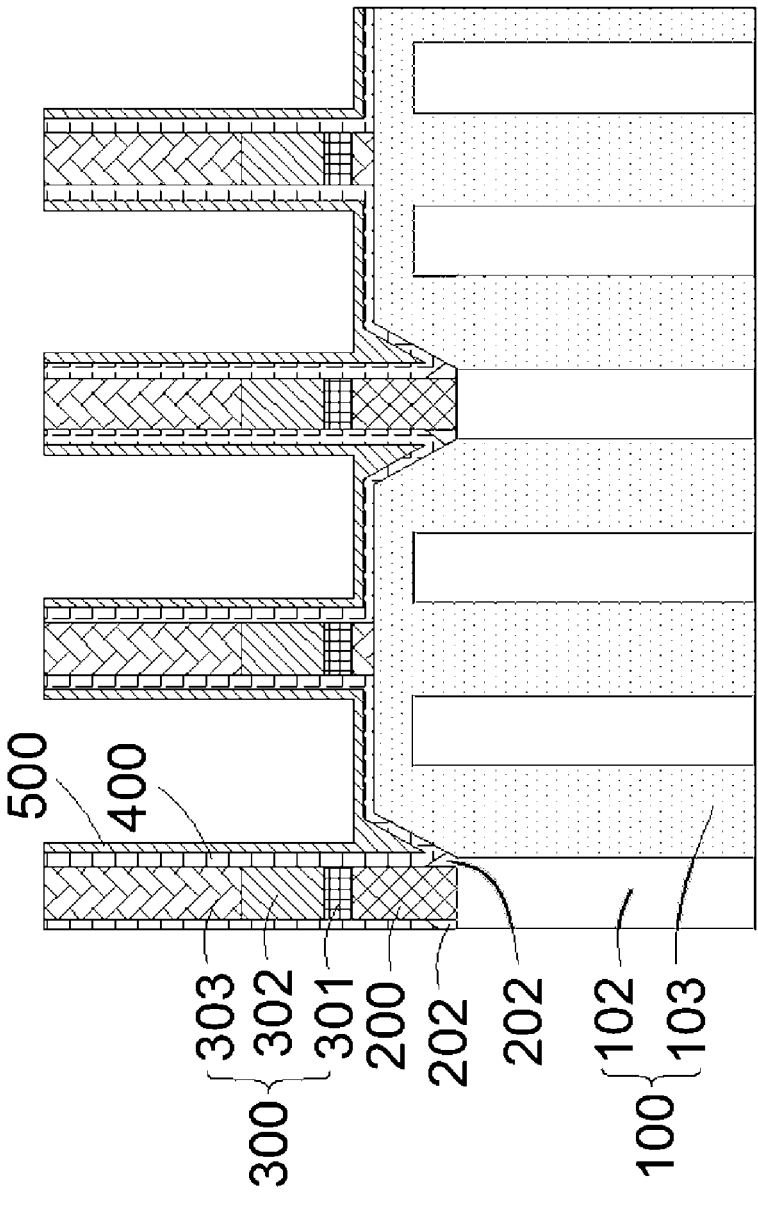

Referring to FIGS. 6 to 7, in some embodiments of the present disclosure, after nitridation of the doped region 201, further includes: forming a second contact structure on the surface of the bit line contact structure 200 and the bit line 300 after the nitridation treatment. A dielectric layer 400; forming a second dielectric layer 500 on the surface of the first dielectric layer 400; wherein, the first dielectric layer 400 and the second dielectric layer 500 are filled in the bit line contact hole 101. After the nitridation treatment, the bit line contact structure 200 of the doped region 201 is consumed, and a first dielectric layer 400 is formed on the surface of the bit line contact structure 200 and the bit line 300 after the nitridation treatment, as shown in FIG. 6. A second dielectric layer 500 is formed on the surface of the first dielectric layer 400, as shown in FIG. 7. Optionally, the material of the first dielectric layer 400 may include but not limited to silicon oxide or silicon nitride, and the material of the second dielectric layer 500 may include but not limited to silicon oxide or silicon nitride. It can be understood that, forming the first dielectric layer 400 on the surface of the bit line contact structure 200 and the bit line 300 after nitridation treatment; forming the second dielectric layer 500 on the surface of the first dielectric layer 400 can be performed by deposition process respectively.

Figure 8:
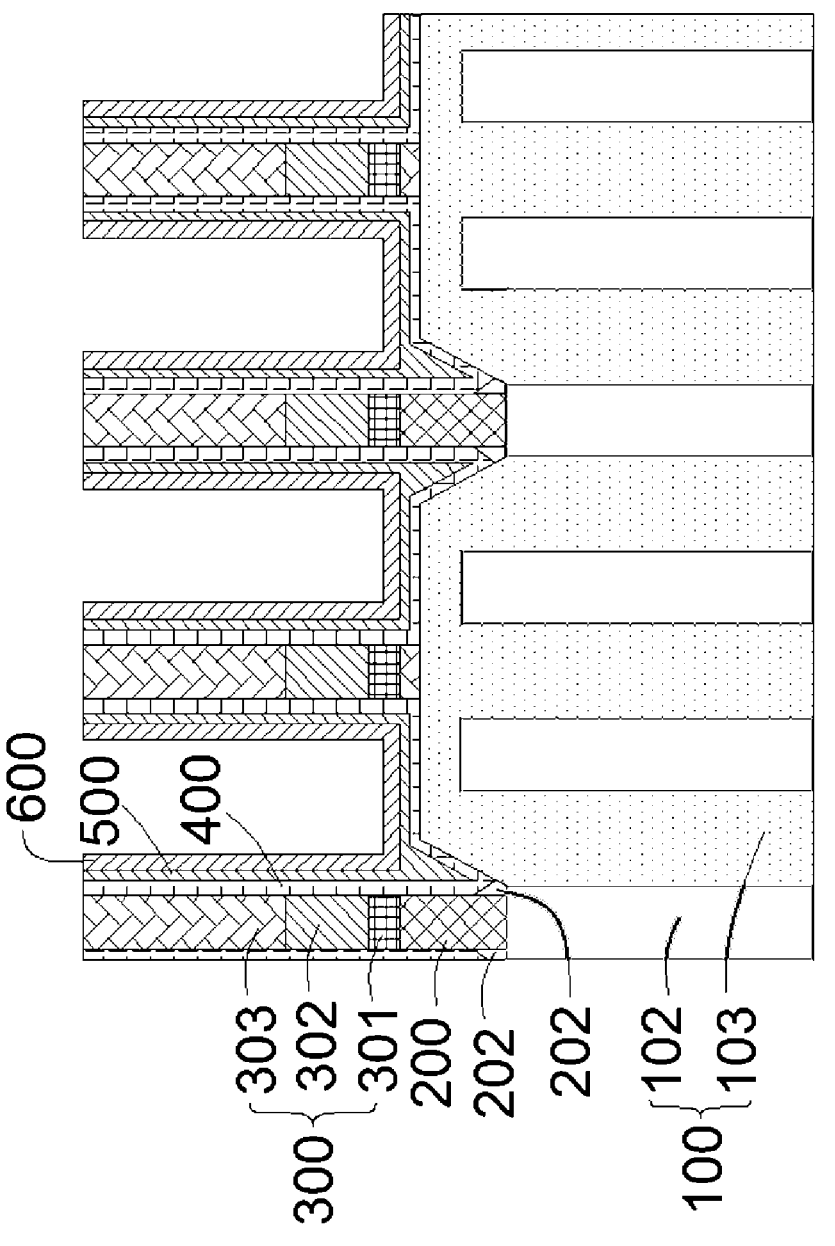

Referring to FIG. 8, after forming the second dielectric layer 500 on the surface of the first dielectric layer 400, it further includes: forming a third dielectric layer 600 on the surface of the second dielectric layer 500, as shown in FIG. 8. Optionally, the material of the third dielectric layer 600 may include but not limited to silicon oxide or silicon nitride. It can be understood that the formation of the third dielectric layer 600 on the surface of the second dielectric layer 500 can be performed by a deposition process.

In some embodiments of the present disclosure, the material of the first dielectric layer 400 is silicon nitride, the material of the second dielectric layer 500 is silicon oxide, and the material of the third dielectric layer 600 is silicon nitride. At this time, the first dielectric layer 400—the second dielectric layer 500—the third dielectric layer 600 is a silicon nitride-silicon oxide-silicon nitride, that is, a "NON" sandwich structure.

In other embodiments of the present disclosure, the material of the first dielectric layer 400 is silicon oxide, the material of the second dielectric layer 500 is silicon nitride, and the material of the third dielectric layer 600 is silicon oxide. At this time, the first dielectric layer 400—the second dielectric layer 500—the third dielectric layer 600 is silicon oxide-silicon nitride-silicon oxide, that is, an "ONO" sandwich structure.

Figure 9:
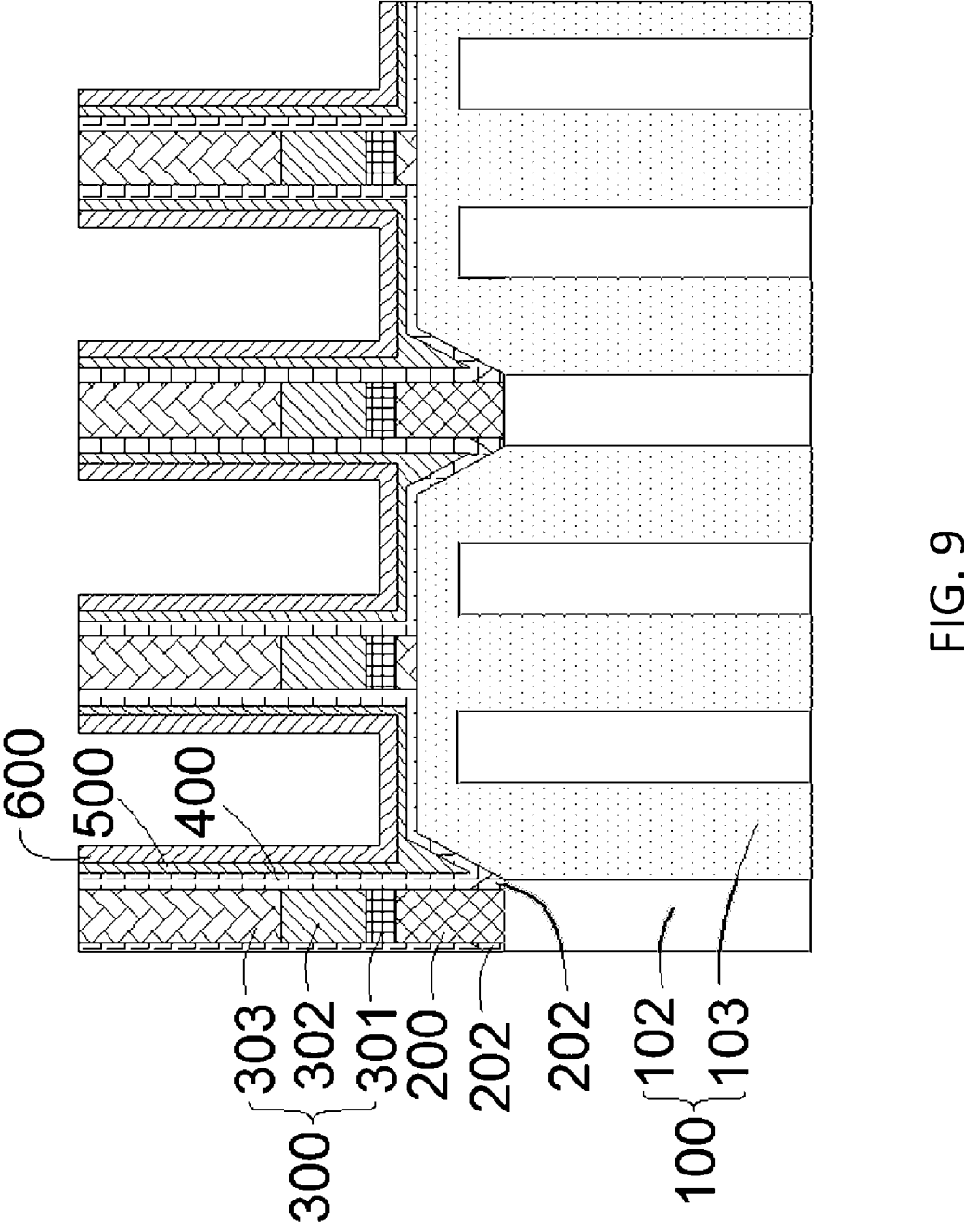

Referring to FIG. 9, in some embodiments of the present disclosure, when the material of the first dielectric layer 400 is silicon nitride, the nitride structure 202 may appear to be integrated into the first dielectric layer 400.

Referring to FIG. 10, in some embodiments of the present disclosure, the method for preparing a semiconductor structure includes:

Step S100: providing a substrate 100;

Step S200: forming a bit line contact structure 200 and a bit line 300 on the substrate 100; the bit line contact structure 200 is located between the bit line 300 and the substrate 100;

Step S300: performing ion doping treatment on the sidewalls of the lower part of the bit line contact structure 200 to form a doped region 201;

Step S400: performing rapid heat treatment on the doped region 201;

Step S500: transforming the doped region 201 into a nitride structure by nitriding the doped region 201;

Step S600: annealing the semiconductor structure obtained after the nitridation treatment;

Step S700: forming a first dielectric layer 400 on the surface of the bit line contact structure 200 and the bit line 300 after the annealing treatment; forming a second dielectric layer 500 on the surface of the first dielectric layer 400;

Step S800: forming a third dielectric layer 600 on the surface of the second dielectric layer 500.

In some embodiments of the present disclosure, before forming the bit line contact structure 200 and the bit line 300 on the substrate 100, it further includes: forming a shallow trench isolation structure 102 in the substrate 100, the shallow trench isolation structure 102 is formed on the substrate A plurality of active regions 103 arranged at intervals are isolated in the bottom 100; the bit lines 300 extend along a first direction, the active regions 103 extend along a second direction, and the first direction intersects with the second direction. Optionally, the first direction and the second direction may intersect obliquely or perpendicularly.

Wherein, the positions of the shallow trench isolation structure 102 and the active region 103 can be referred to FIG. 2 to FIG. 9. Optionally, when forming the shallow trench isolation structure 102 in the substrate 100, etching may be used. Specifically, when the shallow trench isolation structure 102 is formed in the substrate 100, a dry etching process or wet etching process may be applied. When dry etching is used, ion milling etching, plasma etching or reactive ion etching can be applied. In a specific embodiment, gas plasma is selected for dry etching. For example, when performing dry etching, a reactive etching gas is selected for etching, and the reactive etching gas may be $Cl_2$, $CF_4$, or the like. When wet etching is used, the etching solution may be nitric acid, ammonium fluoride, hydrofluoric acid, ethylenediamine, sodium carbonate, and the like. In a specific embodiment, the etching solution includes ammonium fluoride and hydrofluoric acid.

Wherein, an example of the extending direction of the bit line 300 and the active region 103 can be referred to FIG. 4.

In the embodiment shown in FIG. 4, one direction is oblique to the second direction. It can be understood that in this embodiment, the oblique intersection between the first direction and the second direction means that the angle formed between the first direction and the second direction is an acute angle. It can be understood that an acute angle generally refers to an angle greater than 0° and less than 90°. Optionally, the angle formed between the first direction and the second direction may also be an obtuse angle. It can be understood that an obtuse angle generally refers to an angle greater than 900 and less than 180°. In some specific embodiments, the angle formed between the first direction and the second direction may also be 0° and 180°.

Please refer to FIG. 5 again, another embodiment of the present disclosure provides a semiconductor structure. The semiconductor structure is prepared according to the above method for preparing the semiconductor structure; the semiconductor structure includes:

substrate 100;

a bit line contact structure 200, located on the surface of the substrate 100 and in contact with the substrate 100;

a nitride structure 202, located on the sidewalls of the lower part of the bit line contact structure 200 and in contact with the substrate 100; and a bit line 300, located on the bit line contact structure 200.

In some embodiments of the present disclosure, the bit line 300 includes a first bit line conductive layer 301, a second bit line conductive layer 302 and a bit line protection layer 303 which are sequentially stacked from bottom to top.

Please refer to FIG. 4 again. In some embodiments of the present disclosure, a shallow trench isolation structure 102 is formed in the substrate 100, and the shallow trench isolation structure 102 isolates a plurality of active regions 103 arranged at intervals in the substrate 100. Wherein, the bit line 300 extends along a first direction, the active region 103 extends along a second direction, and the first direction intersects the second direction. Optionally, the first direction and the second direction may intersect obliquely or perpendicularly.

Please refer to FIG. 7 again, in some embodiments of the present disclosure, the semiconductor structure includes:

a first dielectric layer 400 covers the surfaces of the bit line contact structure 200, the nitride structure 202 and the bit line 300; and a second dielectric layer 500 covers the surface of the first dielectric layer 400.

Please refer to FIG. 8 again. In some embodiments of the present disclosure, the semiconductor structure includes:

a third dielectric layer 600 covers the surface of the second dielectric layer 500.

The technical features of the above-mentioned embodiments can be combined arbitrarily. To make the description concise, all possible combinations of the technical features of the above-mentioned embodiments are not described. However, as long as there is no contradiction in the combination of these technical features, they should be It is considered to be within the range described in this specification.

The above-mentioned embodiments only express several implementation modes of the present disclosure, and the description thereof is relatively specific and detailed, but should not be construed as limiting the scope of the patent application. It should be noted that those skilled in the art can make several modifications and improvements without departing from the concept of the present disclosure, and these all belong to the protection scope of the present disclosure. Therefore, the scope of protection of the disclosed patent should be based on the appended claims.

The invention claimed is:

1. A method for fabricating a semiconductor structure, comprising:

providing a substrate;

forming a bit line and a bit line contact structure on the substrate, wherein the bit line contact structure is located between the bit line and the substrate;

forming a doped region by performing an ion doping treatment on sidewalls of a lower part of the bit line contact structure; and performing an nitridation treatment on the doped region to transform the doped region into a nitride structure.

2. The method for fabricating the semiconductor structure according to claim 1, wherein an ion dose of the ion doping treatment is in a range of $10^4$ cm$^{-2}$~$10^5$ cm$^{-2}$.

3. The method for fabricating the semiconductor structure according to claim 1, wherein ions used in the ion doping treatment comprise ions of Group V elements.

4. The method for fabricating the semiconductor structure according to claim 3, wherein the ions of the ion doping treatment further comprise at least one of arsenic ions and phosphorus ions.

5. The method for fabricating the semiconductor structure according to claim 1, wherein, after performing the nitridation treatment on the doped region, further comprising:

performing an annealing treatment on the semiconductor structure.

6. The method for fabricating the semiconductor structure according to claim 5, wherein a temperature of the annealing treatment is in a range of 550° C. to 650° C.; and/or, a time for the annealing treatment is in a range of 50 minutes to 70 minutes.

7. The method for fabricating the semiconductor structure according to claim 1, wherein, before performing the nitridation treatment on the doped region, further comprising:

performing a rapid heat treatment on the doped region.

8. The method for fabricating the semiconductor structure according to claim 1, wherein performing the nitridation treatment on the doped region comprises:

a reactive nitridation of the doped region with nitrogen; or, forming a silicon nitride layer on a surface of the doped region to nitride the doped region.

9. The method for fabricating the semiconductor structure according to claim 1, wherein forming the bit line contact structure and the bit line on the substrate comprises:

forming a bit line contact hole in the substrate;

forming a bit line contact material layer in the bit line contact hole;

forming a bit line material layer on an upper surface of the bit line contact material layer; and etching the bit line contact material layer and the bit line material layer to obtain the bit line contact structure and the bit line.

10. The method for fabricating the semiconductor structure according to claim 9, wherein, after performing the nitridation treatment on the doped region, further comprising:

forming a first dielectric layer on the bit line contact structure and the upper surface of the bit line; and forming a second dielectric layer on a surface of the first dielectric layer, wherein the first dielectric layer and the second dielectric layer fill in the bit line contact hole.

11. The method for fabricating the semiconductor structure according to claim 1, wherein, before forming the bit line contact structure and the bit line on the substrate, further comprising:

forming a shallow trench isolation structure in the substrate, wherein the shallow trench isolation structure isolates a plurality of active regions arranged at intervals in the substrate; wherein the bit line extends along a first direction, wherein the plurality of active regions extends along a second direction, and wherein the first direction intersects the second direction.

12. The method for fabricating the semiconductor structure according to claim 1, wherein the bit line comprises a first bit line conductive layer, a second bit line conductive layer, and a bit line protective layer, sequentially stacked from bottom to top.

13. The method for fabricating the semiconductor structure according to claim 12, wherein a material of the first bit line conductive layer comprises titanium nitride; and/or, a material of the second bit line conductive layer comprises tungsten; and/or, a material of the bit line protection layer comprises silicon nitride.

14. A semiconductor structure, which is fabricated according to the method of claim 1, wherein the semiconductor structure comprises:

the substrate;

the bit line contact structure, located on a surface of the substrate and in contact with the substrate;

a nitride structure, located on the sidewalls of the lower part of the bit line contact structure and in contact with the substrate; and the bit line, located on the bit line contact structure.

15. The semiconductor structure of claim 14, comprising:

a first dielectric layer, covering the bit line contact structure, the nitride structure and a surface of the bit line; and a second medium layer, covering a surface of the first dielectric layer.

* * * * *